US011585859B2

United States Patent
Zhang et al.

(10) Patent No.: US 11,585,859 B2
(45) Date of Patent: Feb. 21, 2023

(54) STATE OF CHARGE ERROR ESTIMATION OF BATTERY CELLS BACKGROUND

(71) Applicant: CHONGQING JINKANG POWERTRAIN NEW ENERGY CO., LTD., Chongqing (CN)

(72) Inventors: Wenke Zhang, Santa Clara, CA (US); Saeed Khaleghi Rahimian, Santa Clara, CA (US); Jun Hou, Santa Clara, CA (US); Brennan Campbell, Santa Clara, CA (US); Ying Liu, Santa Clara, CA (US)

(73) Assignee: CHONGQING JINKANG POWERTRAIN NEW ENERGY CO., LTD., Chongqing (CN)

( * ) Notice: Subject to any disclaimer, the term of this patent is extended or adjusted under 35 U.S.C. 154(b) by 1027 days.

(21) Appl. No.: 16/289,667

(22) Filed: Mar. 1, 2019

(65) Prior Publication Data
US 2020/0278399 A1    Sep. 3, 2020

(51) Int. Cl.
| | |
|---|---|
| *G01R 31/00* | (2006.01) |
| *G01R 31/3842* | (2019.01) |
| *H02J 7/00* | (2006.01) |
| *G01R 31/371* | (2019.01) |
| *G07C 5/10* | (2006.01) |
| *G01R 31/3828* | (2019.01) |
| *B60L 58/12* | (2019.01) |
| *G07C 5/08* | (2006.01) |
| *G01R 31/36* | (2020.01) |

(52) U.S. Cl.
CPC .......... *G01R 31/3842* (2019.01); *B60L 58/12* (2019.02); *G01R 31/3648* (2013.01); *G01R 31/371* (2019.01); *G01R 31/3828* (2019.01); *G07C 5/0825* (2013.01); *G07C 5/10* (2013.01); *H02J 7/0047* (2013.01)

(58) Field of Classification Search
USPC ............ 324/426, 433–435; 702/63; 701/32.1
See application file for complete search history.

(56) References Cited

U.S. PATENT DOCUMENTS

| | | | | |
|---|---|---|---|---|
| 4,677,363 | A * | 6/1987 | Kopmann ..........| G01R 31/3648 320/DIG. 21 |
| 2014/0095089 | A1* | 4/2014 | Wu .................... | G01R 31/3842 702/63 |
| 2015/0226807 | A1* | 8/2015 | Aumentado ....... | G01R 31/3842 702/63 |

* cited by examiner

*Primary Examiner* — Vincent Q Nguyen
(74) *Attorney, Agent, or Firm* — Cooper Legal Group, LLC

(57) ABSTRACT

Embodiments described herein generally relate to the modification of State of Charge (SoC) calculations within electric vehicles (EVs). A database of data points may be generated based on characteristics of a battery cell at various measured SoCs within a controlled environment. Subsequently, during the operation of an EV, a battery management system (BMS) within the EV may collect various operating data points. The collected operating data points may be utilized to reference similar data points stored in the database in order to determine an SoC value. The SoC value may be utilized to modify or alter the SoC calculations by the BMS for an EV in operation.

17 Claims, 10 Drawing Sheets

STATE OF CHARGE ERROR ESTIMATION OF BATTERY CELLS BACKGROUND

BACKGROUND

Electric vehicles (EVs) have emerged as a viable mode of transportation in modern society. However, in some ways, EVs may still be inferior to traditional gas-combustion engine vehicles. One such way is determining the amount of energy an EV has remaining. In traditional gas-combustion engines the amount of gas remaining in a tank can be easily measured. On the other hand, because there is no liquid fuel in an EV, the remaining energy must be measured based on the EV's battery. The remaining amount of energy within an EV's battery may be referred to as the state of charge (SoC) of the battery. Measuring the SoC of an EV battery is more difficult than measuring the amount of gas in a gas-combustion engine vehicle. However, these measurements are equally important as a driver ideally should know how much longer they can drive before the vehicle runs out of energy. Furthermore, accurate SoC estimation may be important for an autonomous driving system to determine how or whether the autonomous vehicle may make it to its intended destination. Thus there is a need to improve SoC calculations within EVs.

BRIEF SUMMARY

Embodiments described herein generally relate to modification of SoC calculations within EVs. In one embodiment, a computer-implemented method is provided for generating and displaying a modified state of charge (SoC) estimation. The computer-implemented method may comprise receiving, a first SoC of a test battery cell associated with a first methodology for determining a SoC of the test battery. The computer-implemented method may further comprise receiving, a second SoC of the test battery cell associated with a second methodology for determining the SoC of the test battery cell. The second SoC may be associated with a first rest period. The computer-implemented method may further comprise comparing the first SoC and the second SoC to determine a SoC delta value associated with the first rest period. The computer-implemented method may further comprise modifying, a current SoC reading associated with a battery within an electronic vehicle (EV) by the SoC delta to generate a modified SoC reading. The computer-implemented method may further comprise displaying, to an interface within the EV, the modified SoC reading.

In one embodiment, the first methodology may be based at least in part on a coulomb counting method and the second methodology may be based at least in part on a voltage reading method. In one embodiment, the first SoC is determined based at least in part on a first discharge C-rate and the second SoC is determined based at least in part on a second discharge C-rate and the first discharge C-rate is distinct from the second discharge C-rate.

In one embodiment, the computer-implemented method may further comprise receiving, a past SoC reading associated with a period of time prior to an EV being turned off. The computer-implemented method may further comprise receiving, a second rest period associated with a period of time between the EV being turned off and the EV being turned back on. The computer-implemented method may further comprise querying a data store based at least in part on the past SoC reading and the second rest period to determine the SoC delta.

In one embodiment, the test battery cell and the battery cell within the EV are of a same battery type. In such an embodiment, the same battery type may be a lithium ion battery. In one embodiment, the first SoC of the test battery cell and the second SoC of the test battery cell are associated with the same discharge capacity state of the test battery.

Figure 1:
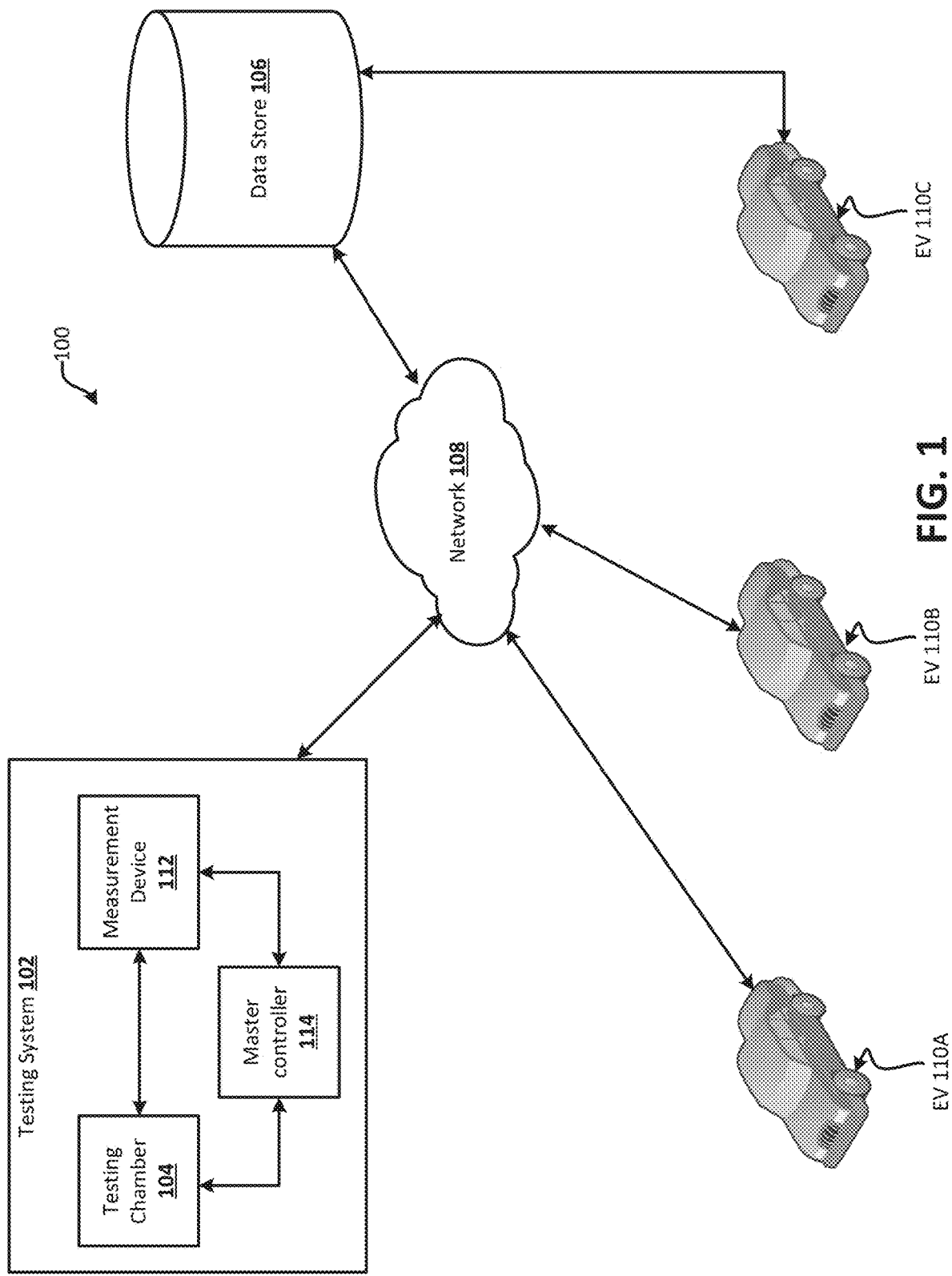
FIG. 1 illustrates an example system in accordance with one or more embodiments.

Features, embodiments, and advantages of the present disclosure are better understood when the following Detailed Description is read with reference to the accompanying drawings.

DETAILED DESCRIPTION

Currently there are two prominent ways to determine the SoC of a battery, voltage reading and coulomb counting. Coulomb counting measures the SoC of a battery by utilizing the following parameters: the current flow into a battery, the current flow out of the battery, and the history of the battery use. Coulomb counting uses an algorithm based on the parameters, but because of the complex nature of the algorithm it may be difficult to apply to an EV battery. Furthermore, Coulomb counting may suffer from drift associated with its algorithm, which can lead to SoC estimation error.

The voltage reading method requires knowing the voltage of a battery when it is fully charged and comparing that voltage to the voltage a certain point in time (e.g., an open circuit voltage (OCV)). Voltage reading is based on the fact that at fully charged a battery's voltage will be higher than when the battery is fully discharged. Thus a change in voltage may indicate a change in the SoC of a battery. As simplistic as the process may seem, voltage may change dramatically based on certain events. For example, immediately after a car is charged the voltage may dramatically fluctuate. This change in voltage may produce an inaccurate SoC reading of the battery as the voltage may have changed but the SoC of the battery may have not changed. Because of the potential variance of voltage based on certain events it is recommended to let the battery rest for a certain period in order for the voltage to stabilize to get an accurate reading. However, such a rest period is impractical for real world use, especially in an EV.

Embodiments disclosed herein present methodologies and systems for determining an SoC error value when determining the SoC of a battery. The SoC error value may be utilized to modify a measured SoC in order to produce a more accurate SoC value that may take into account the inaccuracies of traditional SoC measuring systems. A testing system may perform a first process to determine the open circuit voltage (OCV) for a particular battery cell or particular battery cell type. In the first process, a battery cell may be fully charged and then discharged at a first C-rate (e.g., 1C) to a first discharge capacity and rested for a certain period of time. After the period of time has expired, the voltage may be measured by a voltage reading device. The rest period of time may provide a more accurate voltage reading because the period of rest may allow for the voltage to stabilize at a particular discharge capacity. The testing system may then determine a second discharge capacity to discharge to using the first C-rate. The battery cell is then rested for the rest period again and the voltage is measured by the voltage reading device. This process may be repeated for a variety of discharge capacities until the battery cell is fully discharged (e.g., the voltage reaches a cut-off voltage). The voltages determined from the first process may represent the true voltage reading at a particular discharge capacity (i.e. SoC).

In a second process, the testing system may determine SoC error values. During the second process, the testing system may fully charge a battery cell and discharge the battery cell at a second C-rate to a first discharge capacity and rest for a first period of time. The testing system may measure the voltage of the battery cell at the end of the first period of time. The testing system may then wait a second period of time and measure the voltage of the battery at the end of the second period of time at the same first discharge capacity. The testing system may repeat voltage measurements at different periods of time for the first discharge capacity. The testing system may calculate an SoC value for at each period of time based on the measured voltage. The testing system may assume, for the SoC value calculation, that the measured voltage is the OCV. The result of the calculations may produce SoC error values. The SoC error values represent SoC values that may be estimated based on a voltage at a certain time. However, these values may be erroneous because the voltage (when measured) may not be stable and because the voltage is not stable a SoC value determined based on the voltage may produce an erroneous SoC. The SoC error values may be similar to an SoC determined within a battery management system (BMS) within an EV. The measuring and SoC error value calculation processes may be repeated for a second discharge capacity, third discharge capacity, and so forth.

In a third process, the testing system may compare the OCV value (from the first process) to the SoC error values (from the second process) to determine one or more SoC deltas. A SoC delta may represent a corrective change in value for a more accurate SoC estimation. For example, during the first process a testing system may have measured the OCV value of a battery cell at a coulomb counted estimated SoC of 95% to be 4.095237 volts. In addition, during the second process, the testing system may have measured the voltage of the battery cell at a coulomb counted estimated SoC of 95% to be 4.009 volts after 0 seconds of rest, 4.063 volts after 5 seconds of rest, and 4.096 volts after 3 hours of rest. As a result, there are multiple measured voltage values for a battery cell that has a coulomb counted SoC of 95%. Because, during the first process, the voltage measurement was taken after a long time period, it can be assumed that this voltage measurement is of a stable voltage and is the most accurate. Thus, we can also assume that the less rest a battery cell has the more volatile its voltage may be. During the third process, the testing system may, for example, subtract the SoC error value calculated based on measured voltage during the second process from the known SoC value that was estimated in the first process. In such an example, during the second process, at 0 seconds of rest after discharging to coulomb counted estimation of 95% SoC, the voltage was recorded as being 4.009 volts. The SoC error value when calculated (e.g., voltage measurement based estimation) based on a 4.009 OCV may return a 79.96% SoC value. Thus, the testing system may subtract 95% SoC (true SoC value) from 79.96% (SoC error value) to get an SoC delta of 15.04%. In another example, during the second process, at 5 seconds of rest after discharging to 95% SoC the voltage was recorded as being 4.063 volts. The SoC error value when calculated based on a 4.063 OCV may return a 85.57% SoC value (SoC error value), which results in a SoC delta of 9.43%. The SoC delta may be applied to a calculated SoC value in order to mitigate SoC estimation error due to voltage volatility. For example, if a battery management system (BMS) within an EV measures an SoC (e.g., using coulomb counting) to be 95%, the moment when the discharge is finished (e.g., initially after a discharge ends or a discharging rate is reduced), the SoC estimation by comparing the measured voltage to the true OCV (i.e. voltage-based SoC determination) may have an error of 15.04%. In such an example, the SoC delta may be used to modified an estimated SoC that is based on the measured voltage to produce a more accurate SoC.

FIG. 1 illustrates example system 100 for implementing one or more embodiments. System 100 may comprise a testing system 102, a data store 106, a network 108, and EVs 110A-110C. Testing system 102, data store 106, and one or more EVs 110A-110C may be communicatively connected to each other via network 108. Testing system 102 includes testing chamber 104, measurement device 112, and master controller 114. In one embodiment, testing system 102 may be a fully are partially automated building containing battery cell holders, battery cells to be tested, devices that can detect voltage of a battery cell (e.g., measuring device 112), devices that can detect discharge capacity of a battery cell (e.g., measuring device 112), devices that can appropriate current to a battery cell, a master controller for controlling one or more operations of test system 102 (e.g., master controller 114) and other similar equipment. Testing system 102 may receive battery cells of different types and perform one or more processes to determine a one or more SoC correctional values associated with voltage-based SoC determination. A battery cell type may include a lithium cobalt oxide battery cell, a lithium manganese oxide battery cell, lithium iron phosphate battery cell, lithium nickel manganese cobalt oxide battery cell, lithium nickel cobalt aluminum oxide battery cell, lithium titanate, and the like. While a battery cell is within testing chamber 104, one or more processes may be performed on the battery cell. Testing chamber 104 may be a temperature controlled environment that simulates a low temperature environment. The temperature within testing chamber 104 may be modified by master controller 114. In one embodiment, a battery cell or group of battery cells are charged at room temperature (e.g., 20 degrees Celsius to 25 degrees Celsius) and then placed into testing chamber 104. The battery cell may be rested within testing chamber 104 until the group of battery cell reaches the ambient temperature within testing chamber 104. The battery cell may be subsequently discharged at the ambient temperature and the voltage may be monitored during the discharge process by measuring device 112. As a result of the monitoring, several data points may be generated. For example, a data point may indicate, for particular SoC, the voltage at specific periods of time after a discharge or charge of the battery cell has stopped. These data points may be gathered at different temperatures.

Master controller 114 may calculate from the data points, for a particular battery cell type, one or more SoC delta values. A SoC delta may represent a corrective change in value for a more accurate SoC estimation. To determine one or more SoC delta values, master controller 114 may perform one or more processes. In a first process, master controller 114 may determine the open circuit voltage (OCV) for a particular battery cell or particular battery cell type. In a second process, master controller 114 may determine SoC error values. In a third process, master controller 114 may determine one or more SoC delta values based on the data points generated in the first and second process. Master controller 114 may store a plurality of data points associated with the first, second, and third processes within data store 106. Data points may include measured voltages, determined SoC error values, SoC delta values, and the like.

Measurement device 112 may measure the voltage and discharge capacities of battery cells during a battery cells discharge and/or charging.

Master controller 114 may control one or more processes implemented by testing system 102. For example, master controller 114 may control the temperature setting within test chamber 104. In another example, master controller 114 may receive data from a timer and/or a temperature sensor within test chamber 104 to determine when one or more battery cells have reached the ambient temperature of test chamber 104. In another example, master controller 114 may receive from measurement devices (e.g., measurement device 112) a plurality of data points associated with battery cells. In such an example, master controller 114 may execute an application or logic that may compare the received data points to each other to determine one or more SoC delta values. In one embodiment, master controller 114 may communicate with one or more other parts of testing system 102 by various Internet of Things (IoT) communication protocols such as Message Queue Telemetry Transport (MQTT), Data Distribution Service (DDS), Bluetooth Low-Energy (BLE), Zigbee, WiFi, and the like. Master controller 114 may comprise one or more processors and non-volatile memory. The processor(s) may include single or multicore processors. The processor(s) may include general purpose microprocessors such as ones provided by Intel®, AMD®, ARM®, Freescale Semiconductor, Inc., and the like, that operate under the control of software stored in associated memory. One or more applications may be executed by the processor(s) to perform one or more operations of master controller 114.

Data store 106 may store one or more data points produced by testing system 102. The data points may include information from one or more processes performed by testing system 102. Data points may include for a battery cell tested: a battery cell type, a testing temperature, a discharge C-rate, detected voltage during discharge, detected capacity during discharge, detected voltage during charge, detected capacity during charge, detected voltage during charge, SoC error values, SoC delta values, and the like. In one embodiment, data store 106 is internal to testing system 102. In one embodiment, data store 106 is external to testing system 102 and is connected to testing system 102 via network 108. In one embodiment, data store 106 is internal to one or more EVs 110A-110B. In such an embodiment, data store 106 may be a part of a battery management system (BMS) of an EV. Data store 106 may be implemented by a database, one or more servers, and the like. Data store 106 may be embodied by a physical storage device such as, a hard disk drive (HDD), solid state drive (SSD), and the like.

Network 108 may facilitate communications between the various systems depicted in FIG. 1. Network 108 can be of various types and can include (for example) the Internet, a wide area network (WAN), a local area network (LAN), an Ethernet network, a public or private network, a wired network, a wireless network, and the like, and combinations thereof. Different communication protocols may be used to facilitate the communications including both wired and wireless protocols such as IEEE 802.XX suite of protocols, TCP/IP, IPX, SAN, Bluetooth®, and other protocols. In general, network 108 may include any infrastructure that facilitates communications between the various systems depicted in FIG. 1. In one embodiment, network 108 may be implemented a single communication network.

EVs 110A-110C may be EVs that utilize one or more data points produced by testing system 102. EVs 110-110C may be any type of electronic vehicle. An electronic vehicle may be any automotive vehicle that is fully or partially powered by a rechargeable battery. In one embodiment, the BMS may estimate, based on the a current voltage reading of a battery within the EV, a current SoC value of the battery. In such an embodiment, the BMS may query data store 106 to determine a SoC delta and modify the estimated current SoC value by the SoC delta to produce a modified SoC value. In the depicted embodiment, EV 110A and EV 110B query data store 106 via a network 108 and EV 110C queries data store 106 outside network 108. In such an embodiment, data store 106 or one or more parts of data store 106 may be internal to EV 110C. For example, during the manufacturing of EV 110C, one or more data points within data store 106 may be input into EV 110C such that the BMS within EV 110C may reference one or more SoC deltas implemented in EV 110C.

SoC Error Estimation During Discharge

Figure 2:
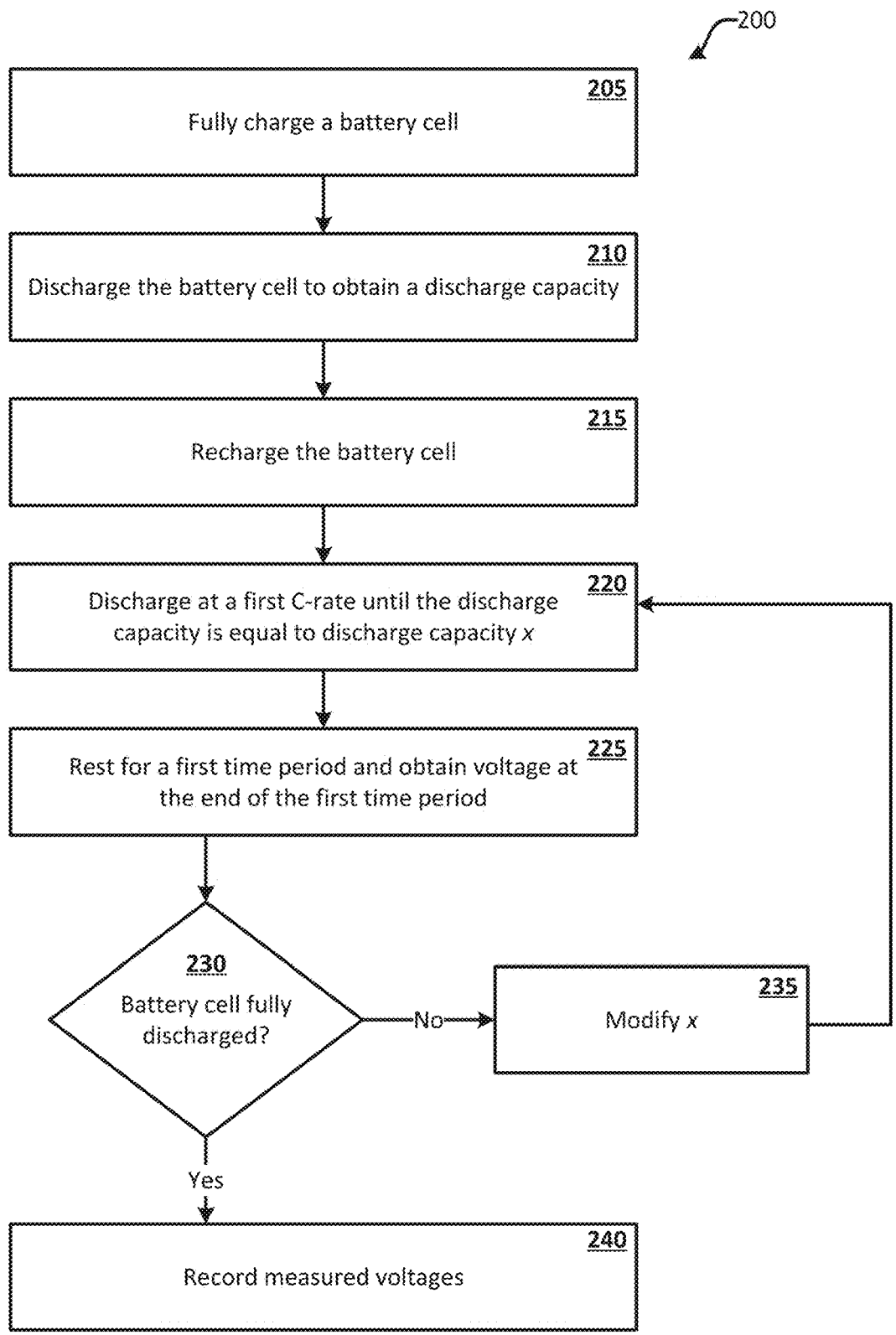
FIG. 2 depicts a simplified first process for determining one or more true OCV values in accordance with one or more embodiments.

FIG. 2 illustrates process 200 for determining a true OCV value for a battery cell at a particular SoC according to one or more embodiments. Process 200 may be implemented by one or more components of a testing system. At 205, the testing system fully charges a battery cell. A measurement device may be utilized to determine when a battery cell reaches a full charge. In one embodiment, full charge may mean that a battery cell has at least a 97% SoC according to a coulomb counting method. In one embodiment, the battery cell may be charged to full capacity (i.e. a full charge) at room temperature (e.g., 20-25 degrees Celsius).

At 210, the testing system discharges the battery cell to obtain a discharge capacity. The fully charged battery cell may be fully discharged (e.g., discharged until a certain cut-off voltage is achieved). The capacity may be measured during this discharging process in order to determine the battery cells discharge capacity. A battery cell's capacity may represent the total ampere-hours (amp-hours or Ah)

available when being discharged at a particular discharge current (e.g. C-rate). In one embodiment, the battery cell may be discharged at room temperature.

At 215, the testing system recharges the battery cell to a full charge. In one embodiment, the battery cell may be recharged at room temperature.

At 220, the testing system discharges the battery cell at a first C-rate until the discharge capacity is equal to discharge capacity x. The variable x may be modified throughout different iterations of process 200. Variable x may be initialized to 95 and may be incrementally reduced by any value such as 5. The C-rate may be the rate of discharge (or charge) as compared to the capacity of the battery cell. For example, a 1C discharge may indicate a current that would discharge a battery cell within an hour to a cut-off voltage. Similarly, a 0.5C rate may indicate a current that would discharge the same battery cell within 2 hours to the cut-off voltage. In addition, a 2C rate may indicate a current that would discharge the same battery cell within a half hour to the cut-off voltage. The cut-off voltage may be the minimum allowable voltage for a battery cell and it is the voltage that generally defines an "empty" state of a battery cell. The first C-rate may be 1C. As a result, in a first iteration the testing system discharges the battery cell at the C-rate of 1C until the discharge capacity of the battery cell is 95%. The discharge capacity may be estimated based on a coulomb counting methodology.

At 225, the testing system allows the battery cell to rest for a first time period and after the first time period obtains the voltage. As previously indicated, voltage readings immediately following a discharge or a charge may be notorious inaccurate for utilization in estimating the SoC of the battery cell. In order to get an accurate voltage that correlates to the SoC determined at 220 (i.e. 95%) the battery cell should be allowed to rest for a first time period so that the voltage may stabilize within the battery cell. The first time period may be based on the type of battery cell. In one embodiment, the first time period may be between 6 and 24 hours. At the end of the first time period, the testing system, via a measuring device, obtains a voltage reading from the battery cell. The testing system may associate, within a data store, this voltage reading with the SoC determined at 220. This voltage reading may be referred to as the true OCV or true OCV value for the particular associated SoC.

At 230, the testing system determines if the battery cell is fully discharged. If the battery cell is not fully discharged then process 200 moves to 235 and variable x is modified and process 200 returns to 220. In one embodiment, variable x may be decreased by 5. Thus allowing a true OCV to be determined for multiple SoCs. However, if the battery cell is fully discharged then process 200 moves to 240 and the measured voltages are recorded within a data store. In one embodiment, each SoC and its associated true OCV are stored within a data store.

Figure 3:
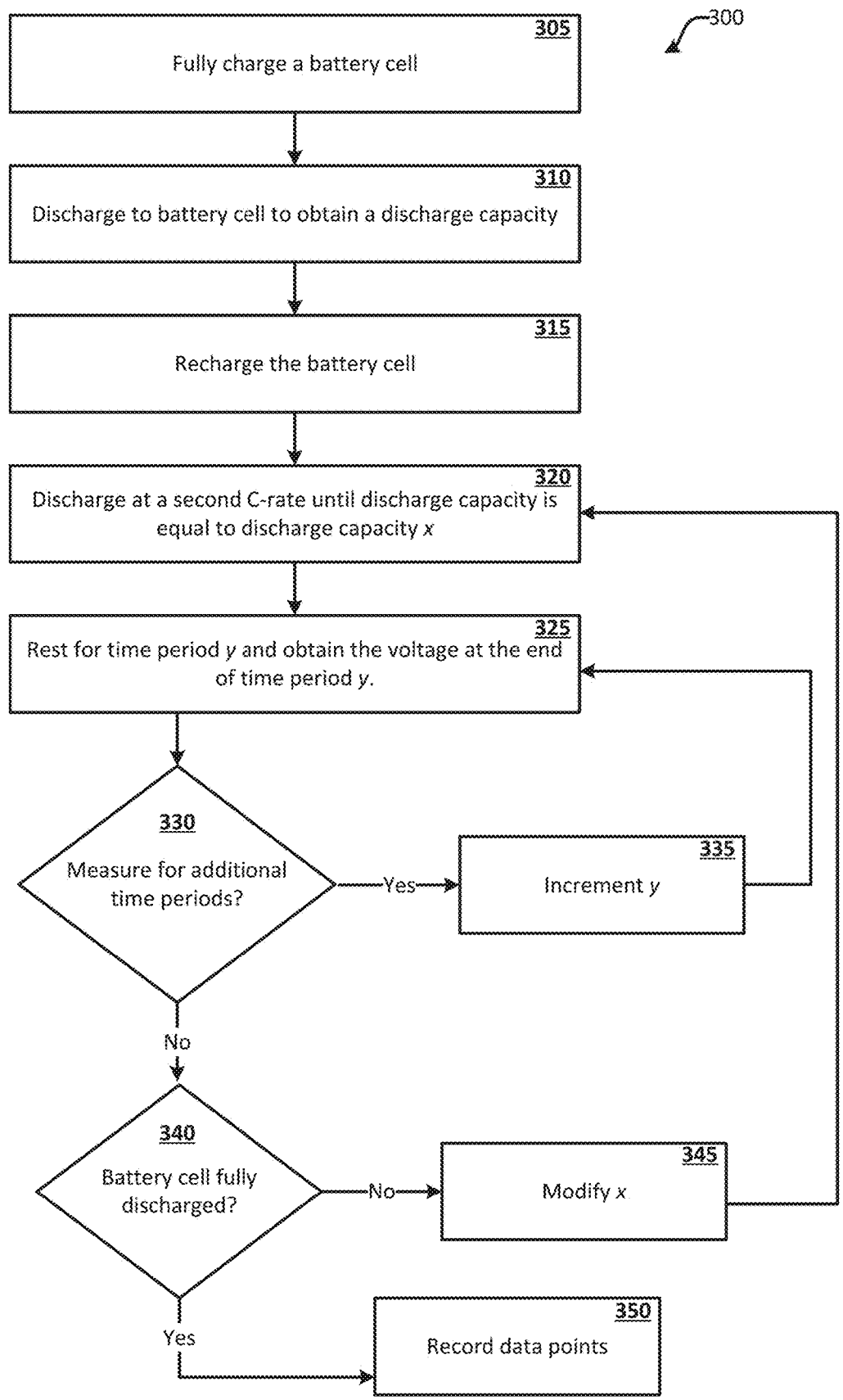
FIG. 3 depicts a simplified first process for determining one or more SoC error values in accordance with one or more embodiments.

FIG. 3 illustrates process 300 for determining a SoC error value for a battery cell at a particular SoC according to one or more embodiments. Process 300 may be implemented by one or more components of a testing system. At 305, the testing system fully charges a battery cell. A measurement device may be utilized to determine when a battery cell reaches a full charge. In one embodiment, full charge may mean that a battery cell has at least a 97% SoC according to a coulomb counting method. In one embodiment, the battery cell may be charged to full capacity (i.e. a full charge) at room temperature (e.g., 20-25 degrees Celsius).

At 310, the testing system discharges the battery cell to obtain a discharge capacity. The fully charged battery cell may be fully discharged (e.g., discharged until a certain cut-off voltage is achieved). In one embodiment, the battery cell may be discharged at room temperature.

At 315, the testing system recharges the battery cell to a full charge. In one embodiment, the battery cell may be recharged at room temperature.

At 320, the testing system discharges the battery cell at a second C-rate until the discharge capacity is equal to discharge capacity x. The variable x may be modified throughout different iterations of process 300. Variable x may be initialized to 95 and may be incrementally reduced by any value such as 5. The second C-rate may be different from the first C-rate described in relation to FIG. 2. For example, the first C-rate may be 1C and the second C-rate may be 0.5C. As a result, in a first iteration the testing system discharges the battery cell at the C-rate of 0.5C until the discharge capacity of the battery cell is 95%. The discharge capacity may be estimated based on a coulomb counting methodology.

At 325, the testing system allows the battery cell to rest for time period y and after time period y obtains the voltage. The variable y may be modified throughout different interactions of process 300. Variable y may be initialized to 0 seconds and may be incrementally increased by an amount of seconds (e.g. 5), minutes (e.g. 10), and/or hours (e.g. 1). As previously indicated, voltage readings immediately following a discharge or a charge may be notorious inaccurate for utilization in estimating the SoC of the battery cell. In order to determine just how inaccurate an SoC calculation would be if it is based on the measured voltage, several voltage measurements may be taken at different time periods. For example, according to a coulomb counting method indicating a SoC is 95% (i.e. discharge capacity x) immediately after (i.e. 0 seconds after the SoC is indicated to be 95%) a voltage measurement may be taken. The testing machine may the perform a voltage-based SoC estimation treating the measured voltage as an OCV. The resulting SoC estimation may be referred to as an SoC error value because it is known that with such a short rest period that an SoC estimation based on the measured voltage is inaccurate due to the voltage volatility at the short rest period. For example, the SoC error value may indicate the estimated SoC at 0 seconds is 79.96%, which is in stark contrast to the SoC of 95% that was determined by a coulomb counting method at 320. The testing system may associate, within a data store, the voltage reading, the time period y, the SoC error value, and the SoC determined at 320. The information within the data store may be utilized to determine an SoC delta that may be used to improve SoC estimations.

At 330, the testing system determines if there are additional time periods to obtain the voltage for. If there are additional time periods then variable y is incremented and process 300 returns to 325. Thus, allowing the testing system to obtain a variety of data points (e.g., SoC error values, voltage measurements, and the like) for various rest times after a discharge. In one embodiment, variable y may be incremented by 5 seconds. However, if there are not additional time periods then process 300 moves to 340.

At 340, the testing system determines if the battery cell is fully discharged. If the battery cell is not fully discharged then process 300 moves to 345 and variable x is modified and process 300 returns to 320. In one embodiment, variable x may be decreased by 5. Thus allowing data points to be determined for multiple SoCs. However, if the battery cell is fully discharged then process 300 moves to 350 and the data points are recorded within a data store.

Figure 4:
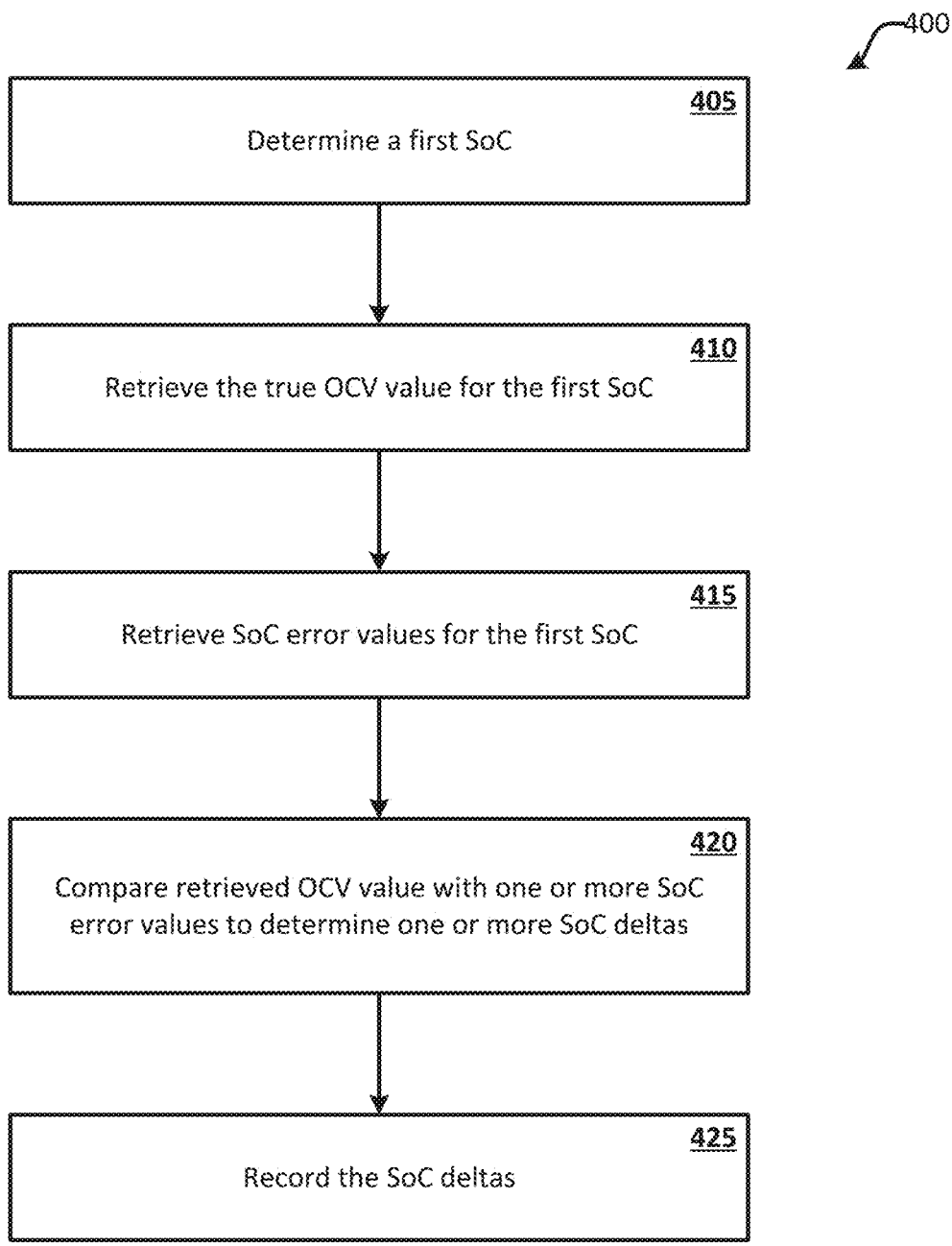
FIG. 4 depicts a simplified first process for determining one or more SoC delta values in accordance with one or more embodiments.

FIG. 4 illustrates process 400 for determining a SoC error value for a battery cell at a particular SoC according to one or more embodiments. On one or more parts of process 400 may be implemented by one or more components of a testing system. At 405, the testing system determines a first SoC for which to find a SoC delta. For example, the first SoC may be a 95% SoC. At 410, the testing system retrieves, from a data store, the true OCV value for the first SoC. The true OCV value may been determined by one or more processes of process 200. At 415, the testing system retrieves, from the data store, SoC error values for the first SoC. The SoC error values may have been determined by one or more processes of process 300. The data store may contain data points associated with the process 200 and 300. For example, Table 1 shown below is an exemplary entry in the data store.

TABLE 1

Sample Data Store Entry

| SoC (Coulomb Counting) | True OCV value | Voltage at 0 seconds | SoC Error Value | Voltage at 5 seconds | SoC Error Value | Voltage at 3 hours | SoC Error Value |
|---|---|---|---|---|---|---|---|
| 95% | 4.095237 volts | 4.009 volts | 79.96% | 4.063 volts | 85.57% | 4.096 | 95.06% |

At 420, the testing system compares the retrieved true OCV value with one or more SoC error values to determine or more SoC deltas. The true OCV value may be assumed to be the most accurate voltage measurement when the SoC, according to a coulomb counting method, is 95%. This is because the true OCV value may be taken after an elongated rest time (e.g. 6 hours). On the other hand, the other voltage measurements associated with the same SoC may produce an inaccurate SoC estimation due to the fluctuation in voltage after a discharge. As can be seen from Table 1, when the same battery cell or same battery cell type is discharged, according to a coulomb counting method, to an SoC of 95% and a voltage reading is taken 0 seconds after the cell has reached the SoC of 95% the voltage reading is vastly different than the true OCV value. Thus, when the voltage reading taken at 0 seconds is used as the OCV value for a voltage-based SoC estimation the determined SoC is vastly different than the SoC derived from coulomb counting. As a result, we know that the SoC error value of 79.96% is inaccurate by the difference between the SoC error value and the SoC derived from the coulomb counting method. In such an example, an SoC delta may be calculated as being 95%−79.96%=15.04%. Thus if a voltage-based SoC is determined 0 seconds after a battery being discharged to 95% the SoC estimation may be off approximately 15.04%. The same methodology of determining an SoC delta may be determined for the voltage measurements taken at 5 seconds and 3 hours. As can be seen from Table 1, the longer the battery rests the lower the SoC delta is. This is because the longer rest period allows the voltage to become more stable.

It should be noted that Table 1 is just an exemplary data entry containing a first set of data points. However, it is within the scope of the embodiments described herein to have many more data points. For example, Table 1 may include voltage readings at 5 seconds, 10 seconds, 15 seconds, 20 seconds, and so forth along with corresponding SoC error values. In one example, Table 1 may include data points for different measured voltages and corresponding SoC error values for different C-rates. In such an example, there may be a data points associated with a 0.2C discharge rate, 0.4C discharge rate, and so forth up until a 2C discharge rate. In one embodiment, an average SoC delta may be calculated for a rest time period according to a plurality of SoC values. In such an embodiment, there may be a determined SoC delta for a 95% SoC at 0 seconds, a SoC delta for 85% SoC at 0 seconds, a SoC delta for 75% SoC at 0 seconds, and the like. All of these SoC deltas may be averaged together to form an average SoC delta for 0 seconds. This may act as a normalized SoC delta may be utilized to adjust SoC estimates 0 seconds after a discharge has ended. A similar process may be utilized for different time periods. At 425, the SoC deltas are recorded within the data store.

Figure 5:
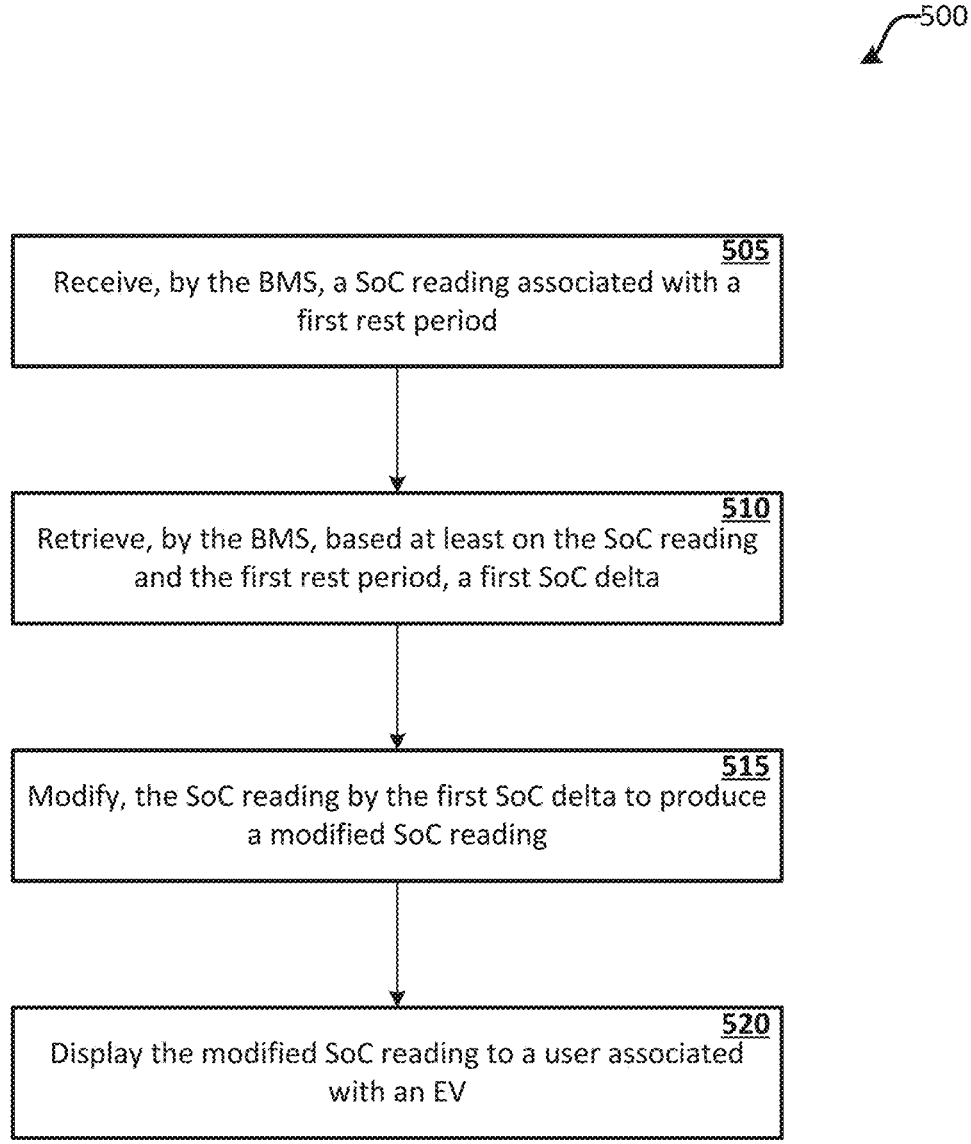
FIG. 5 depicts a simplified first process for modifying a SoC reading according to one or more SoC delta values in accordance with one or more embodiments.

FIG. 5 illustrates process 500 for determining a modified SoC reading within an EV according to one or more embodiments. On one or more parts of process 500 may be implemented by one or more components of a BMS resident on the EV. At 505, the BMS receives an SoC reading associated with a first rest period. The SoC reading may be a voltage-based SoC reading that determines the current SoC of a battery within the EV. The rest period may indicate a period of time since a discharge of the battery stopped. For example, the SoC reading may be generated upon an initial startup an EV such as after a charging process or at the end of a braking process with a rest period of 0 seconds, 5 seconds, and the like.

At 510, the BMS retrieves, based at least in part on the first rest period and the SoC reading, a first SoC delta. The first SoC delta may be retrieved from the data store by querying the data store based on the first rest period and/or the SoC reading. In one embodiment, the data store may comprise an average SoC delta based on rest time. In such an embodiment, the BMS may query the data store for the average SoC delta based on its first rest period. In one embodiment, the BMS may query the data store based on the SoC reading and the first rest period. In such an embodiment, the SoC reading, even being voltage-based may be accurate because the discharge, at that point in time, may be on going. Thus as soon as the discharging stops (e.g., a person stops their EV) a first rest period timer may start and upon the EV commencing discharging (e.g., person starts back up their EV) the first rest period timer may end and the value of the first period rest timer may be utilized to modify retrieve an SoC delta value. For example, if prior to a discharge stopping the SoC estimation indicated a 80% SoC and a person stopped their EV, the first rest period timer would start. Next, whenever the person started back up their EV, the first rest period timer would end and the ending value (e.g., 2 minutes) may be utilized with the last SoC value (e.g., 80%) to query the data store to determine the nearest SoC delta. In such an example, there may be an SoC delta for a SoC of 80% and a rest period of 1 minute at 55 seconds. That particular SoC delta may be the closest data point to the received parameters (i.e., SoC reading and first rest period).

In one embodiment, the BMS may query the data store based on a discharge C-rate. For example, if prior to a discharge stopping, the SoC estimation indicated a 80% SoC and a person stopped their EV, the first rest period timer would start. Next, whenever the person started back up their EV, the first rest period timer would end and the ending value (e.g., 2 minutes) may be utilized with the last SoC value (e.g., 80%) and the current C-rate (e.g., 0.5C) to query the data store to determine the nearest SoC delta. The C-rate may be the current rate at which the battery cell within the EV is discharging. In such an example, there may be an SoC delta for a SoC of 80%, a rest period of 1 minute at 55 seconds, and a C-rate of 0.5C. That particular SoC delta may be the closest data point to the received parameters (i.e., SoC reading, first rest period, and C-rate). Including the C-rate in the determination of which SoC delta to retrieve may be important in cold weather temperatures where an increased C-rate may be often utilized.

In one embodiment, the BMS may query the data store based on the voltage measured. For example, at a first time period (e.g., 0 seconds) a voltage-based SoC reading may indicate a charge of 80% with a voltage reading of 4.19 volts. At a second time period (e.g., 10 seconds) the voltage-based SoC reading may indicate a charge of 75% with a voltage reading of 4.18. Thus, there may be a 0.01 voltage delta over a 10 second period. The BMS may then query the data s tore for a 0.01 voltage delta over a 10 second to determine an SoC that after 10 seconds may have a 0.01 voltage delta. By utilizing a voltage delta, the BMS may be able to retrieve an accurate SoC based not on a voltage-based SoC, but instead on the change in a measured voltage.

At 515, the BMS may modify the SoC reading by the first SoC delta to produce a modified SoC reading. The SoC reading may be adjusted based on the retrieved SoC delta at 510. For example, if the retrieved SoC delta is 10% and the current SoC reading is 56% then the modified SoC reading may be 66%. In another example, if the retrieved SoC delta is 10% and the current SoC reading is 56% then the modified SoC reading may be 46%. The SoC delta may be utilized as a correction mechanism in voltage-based (and other) SoC estimation calculations.

At 520, the BMS may display to a user associated with EV the modified SoC reading. The modified SoC reading may help the user of the EV make better informed choices such as if they need to charge their EV. By producing a more accurate SoC reading the usability of EVs may be greatly enhanced.

In one embodiment, in addition to displaying the modified SoC reading the modified SoC reading may be utilized to alter one or more aspects of the EV. For example, the modified SoC reading may be utilized by the BMS to turn off or reduce one or more operations of the EV. In such an example, upon the modified SoC reading indicating a SoC below a certain threshold (e.g., 20%), the BMS may reduce the air conditioning or heating (or other EV functionalities) with the EV in order to conserve battery. In a related example, upon the modified SoC reading indicating a SoC below a certain threshold (e.g. 40%), the BMS may limit the discharge current (in warm environments) of the battery to preserve the battery. In such an example, the BMS may change the driving mode for the EV to an economy mode which may reduce performance of the EV at the benefit of prolonging battery life. In another example, the modified SoC reading may be utilized by the BMS in an autonomous vehicle to determine one or more routes. In such an example, the modified SoC reading may utilized by the BMS to change a route the autonomous vehicle takes. For example, prior to modifying the SoC reading, an autonomous vehicle may be scheduled to take a first route utilizing inner city roads. However, upon modifying the SoC reading, the autonomous vehicle may reroute the first route to a second route that utilizes highway roads in order to preserve the battery's charge. In another example, the modified SoC reading may be utilized by the BMS to add a stop along a global positioning system (GPS)-based route to redirect an EV to a recharging station. In such an example, whenever the modified SoC reading is below a certain threshold, a stop indicating a recharging station may be added to a current GPS-based route. The additional stop may be automatically travelled to in the case when the EV is in an autonomous driving mode.

SoC Error Estimation During Charge

Figure 6:
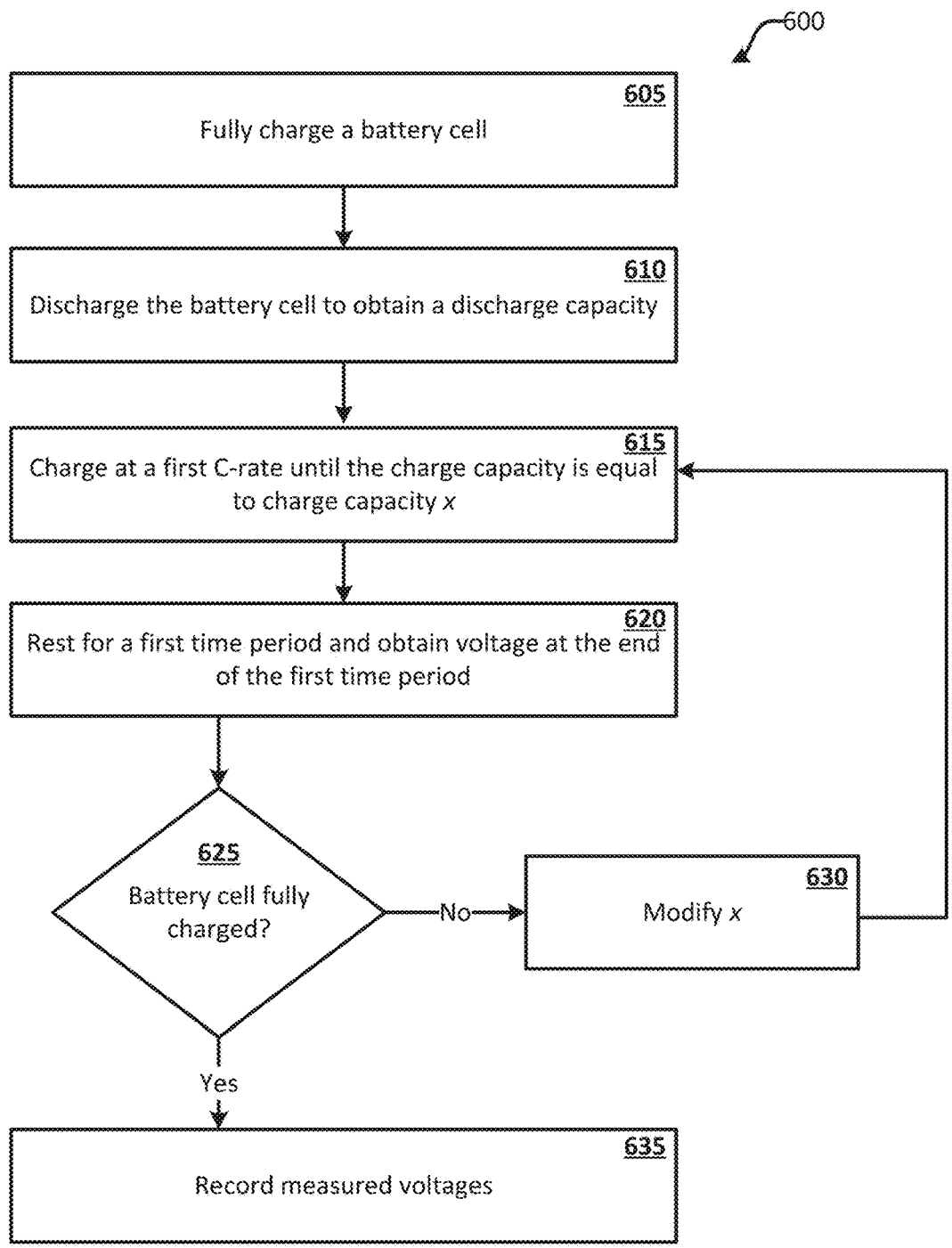
FIG. 6 depicts a simplified second process for determining one or more true OCV values in accordance with one or more embodiments.

Processes similar to those described in FIGS. 2-5 may be applied to the charging process of a battery cell. Similar to a discharge process of a battery cell, immediately after a charge process of a battery cell has ended a voltage reading may not produce an accurate SoC estimation according to a voltage-based SoC estimation. FIG. 6 illustrates process 600 for determining a true OCV value for a battery cell at a particular SoC according to one or more embodiments. Process 600 may be implemented by one or more components of a testing system. At 605, the testing system fully charges a battery cell. A measurement device may be utilized to determine when a battery cell reaches a full charge. In one embodiment, full charge may mean that a battery cell has at least a 97% SoC according to a coulomb counting method. In one embodiment, the battery cell may be charged to full capacity (i.e. a full charge) at room temperature (e.g., 20-25 degrees Celsius).

At 610, the testing system discharges the battery cell to obtain a discharge capacity. The fully charged battery cell may be fully discharged (e.g., discharged until a certain cut-off voltage is achieved). The capacity may be measured during this discharging process in order to determine the battery cells discharge capacity. A battery cell's capacity may represent the total ampere-hours (amp-hours or Ah) available when being discharged at a particular discharge current (e.g. C-rate). In one embodiment, the battery cell may be discharged at room temperature.

At 615, the testing system charges the battery cell at a first C-rate until the charge capacity is equal to charge capacity x. The variable x may be modified throughout different iterations of process 600. Variable x may be initialized to 5 and may be incremented by any value such as 5. The C-rate may be the rate of charge as compared to the capacity of the battery cell. For example, a 1C discharge may indicate a current that would fully charge a battery cell within an hour from a cut-off voltage. Similarly, a 0.5C rate may indicate a current that would charge the same battery cell within 2 hours from the cut-off voltage. In addition, a 2C rate may indicate a current that would charge the same battery cell within a half hour from the cut-off voltage. The cut-off voltage may be the minimum allowable voltage for a battery cell and it is the voltage that generally defines an "empty" state of a battery cell. The first C-rate may be 1C. As a result, in a first iteration the testing system charges the battery cell at the C-rate of 1C until the charge capacity of the battery cell is 5% (i.e. the SoC is at 5%). The charge capacity may be estimated based on a coulomb counting methodology.

At 620, the testing system allows the battery cell to rest for a first time period and after the first time period obtains the voltage. As previously indicated, voltage readings immediately following a discharge or a charge may be notorious inaccurate for utilization in estimating the SoC of the battery cell. In order to get an accurate voltage that correlates to the SoC determined at 615 (i.e. 5%) the battery cell should be allowed to rest for a first time period so that the voltage may stabilize within the battery cell. The first time period may be based on the type of battery cell. In one embodiment, the first time period may be between 6 and 24 hours. At the end of the first time period, the testing system, via a measuring device, obtains a voltage reading from the battery cell. The testing system may associate, within a data store, this voltage reading with the SoC determined at 615. This voltage reading may be referred to as the true OCV or true OCV value for the particular associated SoC.

At 625, the testing system determines if the battery cell is fully charged. If the battery cell is not fully charged then process 600 moves to 630 and variable x is modified and process 600 returns to 615. In one embodiment, variable x may be increased by 5. Thus allowing a true OCV to be determined for multiple SoCs. However, if the battery cell is fully charged then process 600 moves to 635 and the measured voltages are recorded within a data store. In one embodiment, each SoC and its associated true OCV are stored within a data store.

Figure 7:
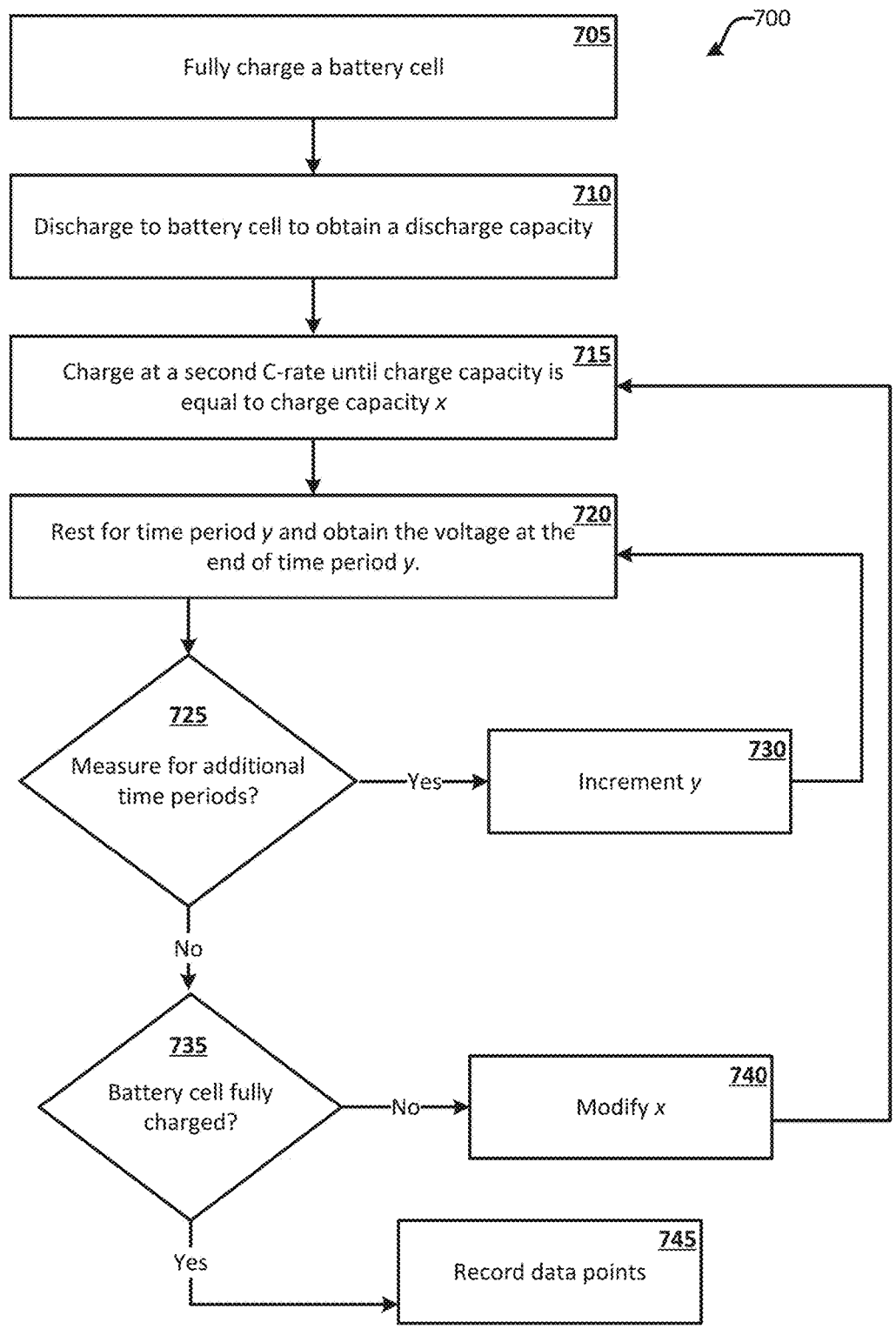
FIG. 7 depicts a simplified second process for determining one or more SoC error values in accordance with one or more embodiments.

FIG. 7 illustrates process 700 for determining a SoC error value for a battery cell at a particular SoC according to one or more embodiments. Process 700 may be implemented by one or more components of a testing system. At 705, the testing system fully charges a battery cell. A measurement device may be utilized to determine when a battery cell reaches a full charge. In one embodiment, full charge may mean that a battery cell has at least a 97% SoC according to a coulomb counting method. In one embodiment, the battery cell may be charged to full capacity (i.e. a full charge) at room temperature (e.g., 20-25 degrees Celsius).

At 710, the testing system discharges the battery cell to obtain a discharge capacity. The fully charged battery cell may be fully discharged (e.g., discharged until a certain cut-off voltage is achieved). In one embodiment, the battery cell may be discharged at room temperature.

At 715, the testing system charges the battery cell at a second C-rate until the charge capacity is equal to charge capacity x. The variable x may be modified throughout different iterations of process 700. Variable x may be initialized to 5 and may be incremented by any value such as 5. The second C-rate may be different from the first C-rate described in relation to FIG. 6. For example, the first C-rate may be 1C and the second C-rate may be 0.5C. As a result, in a first iteration the testing system charges the battery cell at the C-rate of 0.5C until the charge capacity of the battery cell is 5%. The charge capacity may be estimated based on a coulomb counting methodology.

At 720, the testing system allows the battery cell to rest for time period y and after time period y obtains the voltage. The variable y may be modified throughout different interactions of process 700. Variable y may be initialized to 0 seconds and may be incrementally increased by an amount of seconds (e.g. 5), minutes (e.g. 10), and/or hours (e.g. 1). As previously indicated, voltage readings immediately following a discharge or a charge may be notorious inaccurate for utilization in estimating the SoC of the battery cell. In order to determine just how inaccurate an SoC calculation would be if it is based on the measured voltage, several voltage measurements may be taken at different time periods. For example, according to a coulomb counting method indicating a SoC is 5% (i.e. charge capacity x) immediately after (i.e. 0 seconds after the SoC is indicated to be 5%) a voltage measurement may be taken. The testing machine may the perform a voltage-based SoC estimation treating the measured voltage as an OCV. The resulting SoC estimation may be referred to as an SoC error value because it is known that with such a short rest period that an SoC estimation based on the measured voltage is inaccurate due to the voltage volatility at the short rest period. For example, the SoC error value may indicate the estimated SoC at 0 seconds is 20.04%, which is in stark contrast to the SoC of 5% that was determined by a coulomb counting method at 715. The testing system may associate, within a data store, the voltage reading, the time period y, the SoC error value, and the SoC determined at 715. The information within the data store may be utilized to determine an SoC delta that may be used to improve SoC estimations.

At 725, the testing system determines if there are additional time periods to obtain the voltage for. If there are additional time periods then variable y is incremented and process 700 returns to 720. Thus, allowing the testing system to obtain a variety of data points (e.g., SoC error values, voltage measurements, and the like) for various rest times after a charge. In one embodiment, variable y may be incremented by 5 seconds. However, if there are not additional time periods then process 700 moves to 735.

At 735, the testing system determines if the battery cell is fully charged. If the battery cell is not fully charged then process 700 moves to 740 and variable x is modified and process 700 returns to 720. In one embodiment, variable x may be increased by 5. Thus allowing data points to be determined for multiple SoCs. However, if the battery cell is fully charged then process 700 moves to 745 and the data points are recorded within a data store.

Figure 8:
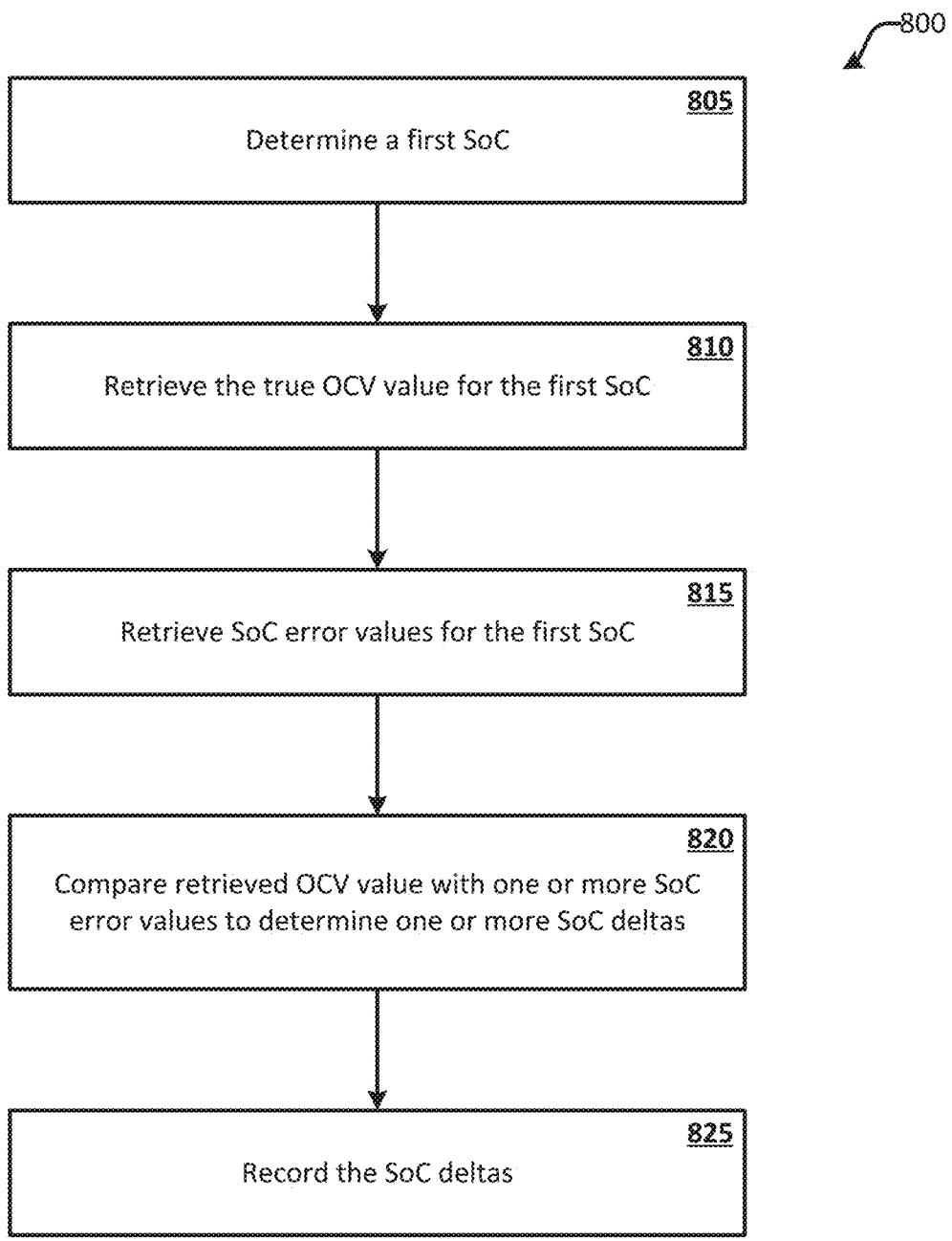
FIG. 8 depicts a simplified second process for determining one or more SoC delta values in accordance with one or more embodiments.

FIG. 8 illustrates process 800 for determining a SoC error value for a battery cell at a particular SoC according to one or more embodiments. On one or more parts of process 800 may be implemented by one or more components of a testing system. At 805, the testing system determines a first SoC for which to find a SoC delta. For example, the first SoC may be a 5% SoC. At 810, the testing system retrieves, from a data store, the true OCV value for the first SoC. The true OCV value may been determined by one or more processes of process 600. At 815, the testing system retrieves, from the data store, SoC error values for the first SoC. The SoC error values may have been determined by one or more processes of process 700. The data store may contain data points associated with the process 600 and 700. For example, Table 2 shown below is an exemplary entry in the data store.

TABLE 2

| \multicolumn{8}{c}{Sample Data Store Entry} |
|---|---|---|---|---|---|---|---|
| SoC (Coulomb Counting) | True OCV value | Voltage at 0 seconds | SoC Error Value | Voltage at 5 seconds | SoC Error Value | Voltage at 3 hours | SoC Error Value |
| 5% | 3.1 volts | 3.21 volts | 20% | 3.117 volts | 15% | 3.12 | 8% |

At 820, the testing system compares the retrieved true OCV value with one or more SoC error values to determine or more SoC deltas. The true OCV value may be assumed to be the most accurate voltage measurement when the SoC, according to a coulomb counting method, is 5%. This is because the true OCV value may be taken after an elongated rest time (e.g. 6 hours). On the other hand, the other voltage measurements associated with the same SoC may produce an inaccurate SoC estimation due to the fluctuation in voltage after a charge. As can be seen from Table 2, when the same battery cell or same battery cell type is charged, according to a coulomb counting method, to an SoC of 5% and a voltage reading is taken 0 seconds after the cell has reached the SoC of 5% the voltage reading is vastly different than the true OCV value. Thus, when the voltage reading taken at 0 seconds is used as the OCV value for a voltage-based SoC estimation the determined SoC is vastly different than the SoC derived from coulomb counting. As a result, we know that the SoC error value of 20% is inaccurate by the difference between the SoC error value and the SoC derived from the coulomb counting method. In such an example, an SoC delta may be calculated as being 20%-5%=15%. Thus if a voltage-based SoC is determined 0 seconds after a battery being charged to 5% the SoC estimation may be off approximately 15%. The same methodology of determining an SoC delta may be determined for the voltage measurements taken at 5 seconds and 3 hours. As can be seen from Table 2, the longer the battery rests the lower the SoC delta is. This is because the longer rest period allows the voltage to become more stable.

It should be noted that Table 2 is just an exemplary data entry containing a first set of data points. However, it is within the scope of the embodiments described herein to have many more data points. For example, Table 2 may include voltage readings at 5 seconds, 10 seconds, 15 seconds, 20 seconds, and so forth along with corresponding SoC error values. In one example, Table 2 may include data points for different measured voltages and corresponding SoC error values for different C-rates. In such an example, there may be a data points associated with a 0.2C charge rate, 0.4C charge rate, and so forth up until a 2C charge rate. In one embodiment, an average SoC delta may be calculated for a rest time period according to a plurality of SoC values. In such an embodiment, there may be a determined SoC delta for a 5% SoC at 0 seconds, a SoC delta for 15% SoC at 0 seconds, a SoC delta for 25% SoC at 0 seconds, and the like. All of these SoC deltas may be averaged together to form an average SoC delta for 0 seconds. This may act as a normalized SoC delta may be utilized to adjust SoC estimates 0 seconds after a charge has ended. A similar process may be utilized for different time periods. At 425, the SoC deltas are recorded within the data store. Similar to the SoC deltas derived for the discharge process of a battery cell, the SoC deltas derived for the charge process of a battery cell may be used to modify an SoC reading. A process for modifying an SoC reading according to an SoC delta for a charging process may be similar to the process illustrated in FIG. 5.

SoC Error Estimation in Different Temperatures

Processes similar to those described in FIGS. 2-8 may be applied to the discharging or charging process of a battery cell at different temperatures. When operating a battery at different temperatures, and in particular low temperatures, it may be difficult to accurately measure a battery cells SoC because the capacity of a battery may decrease as the battery cell gets colder and potentially subsequently increase when the battery warms from its cold state. This fluctuation in battery capacity along with voltage fluctuations may make it particularly difficult to determine an accurate SoC at varying temperatures. The following figures (FIGS. 9-11) and their associated processes may be described in terms of a discharging process. However, similar processes may be implemented for charging processes.

Figure 9:
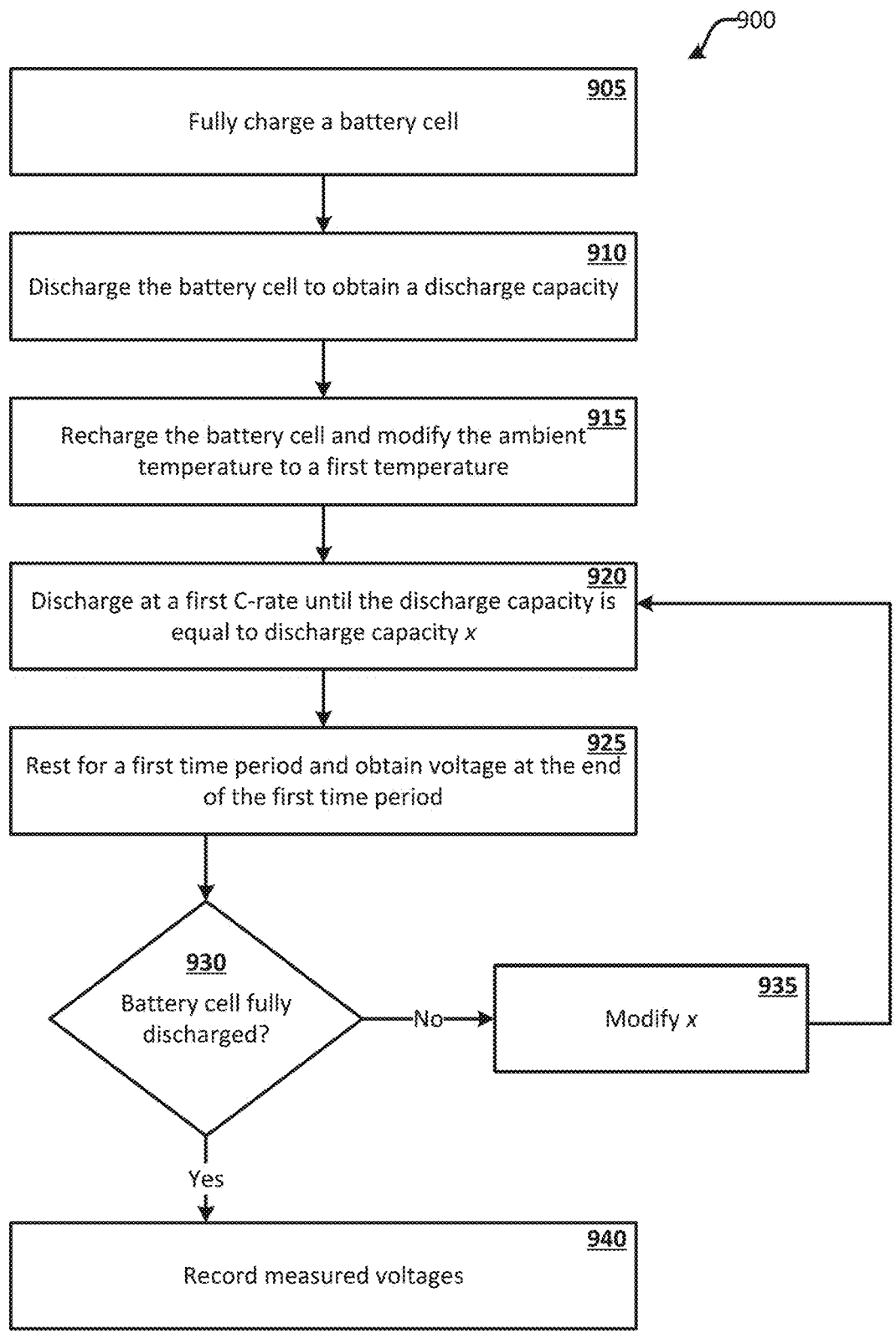
FIG. 9 depicts a simplified third process for determining one or more true OCV values in accordance with one or more embodiments.

FIG. 9 illustrates process 900 for determining a true OCV value for a battery cell at a particular temperature for a particular SoC according to one or more embodiments. Process 900 may be implemented by one or more components of a testing system. At 905, the testing system fully charges a battery cell. A measurement device may be utilized to determine when a battery cell reaches a full charge. In one embodiment, full charge may mean that a battery cell has at least a 97% SoC according to a coulomb counting method. In one embodiment, the battery cell may be charged to full capacity (i.e. a full charge) at room temperature (e.g., 20-25 degrees Celsius).

At 910, the testing system discharges the battery cell to obtain a discharge capacity. The fully charged battery cell may be fully discharged (e.g., discharged until a certain cut-off voltage is achieved). The capacity may be measured during this discharging process in order to determine the battery cells discharge capacity. A battery cell's capacity may represent the total ampere-hours (amp-hours or Ah) available when being discharged at a particular discharge current (e.g. C-rate). In one embodiment, the battery cell may be discharged at room temperature.

At 915, the testing system recharges the battery cell to a full charge and modifies the ambient temperature of the battery cell to a first temperature. In one embodiment, the battery cell may be within a testing chamber that is capable of having its temperature modified. For example, the ambient temperature with the test chamber may be set and maintained at 35 degrees Celsius, 10 degrees Celsius, 0 degrees Celsius, -10 degrees Celsius and the like. In one embodiment, the ambient temperature may be set and maintained to any temperature such as between -50 degrees Celsius and 43 degrees Celsius. The following table (Table 3) illustrates sample testing temperatures and corresponding first discharge rates.

TABLE 3

Sample Testing Temperatures and C-rates

| First temperature (Celsius) | First C-rate |
|---|---|
| 35 | 0.5C |
| 10 | 0.75C |
| 0 | 1C |
| -10 | 1.5C |

At 920, the testing system discharges, at the first temperature, the battery cell at a first C-rate until the discharge capacity is equal to discharge capacity x. The variable x may be modified throughout different iterations of process 900. Variable x may be initialized to 95 and may be incrementally reduced by any value such as 5. The C-rate may be the rate of discharge (or charge) as compared to the capacity of the battery cell. In a first iteration the testing system discharges the battery cell at the C-rate of 1C until the discharge capacity of the battery cell is 95%. The discharge capacity may be estimated based on a coulomb counting methodology.

At 925, the testing system allows the battery cell to rest, at the first temperature, for a first time period and after the first time period obtains the voltage. The first time period may be based on the type of battery cell. In one embodiment, the first time period may be between 6 and 24 hours. At the end of the first time period, the testing system, via a measuring device, obtains a voltage reading from the battery cell. The testing system may associate, within a data store, this voltage reading with the SoC determined at 920. This voltage reading may be referred to as the true OCV or true OCV value for the particular associated SoC.

At 930, the testing system determines if the battery cell is fully discharged. If the battery cell is not fully discharged then process 900 moves to 935 and variable x is modified and process 900 returns to 920. In one embodiment, variable x may be decreased by 5. Thus allowing a true OCV to be determined for multiple SoCs. However, if the battery cell is fully discharged then process 900 moves to 940 and the measured voltages are recorded within a data store. In one embodiment, each SoC and its associated true OCV are stored within a data store. In one embodiment, processes 915-940 may be repeated for a different temperature. In such an embodiment, the first temperature may be incremented to a second temperature which may be above or below the first temperature. By modifying the temperature true OCVs and SoCs may be determined for different temperatures.

Figure 10:
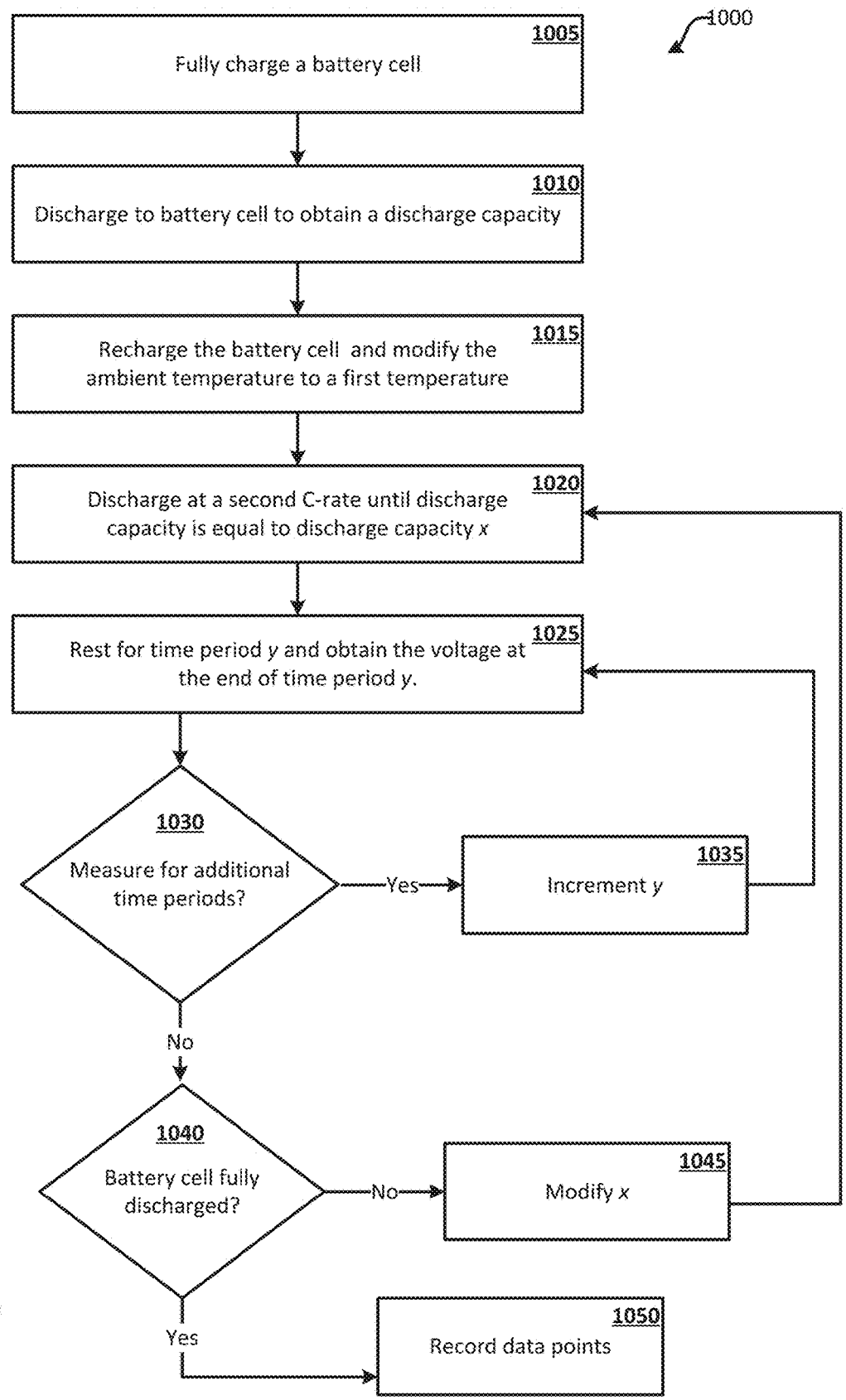
FIG. 10 depicts a simplified third process for determining one or more SoC error values in accordance with one or more embodiments.

FIG. 10 illustrates process 1000 for determining a SoC error value for a battery cell at a particular temperature for a particular SoC according to one or more embodiments. Process 1000 may be implemented by one or more components of a testing system. At 1005, the testing system fully charges a battery cell. A measurement device may be utilized to determine when a battery cell reaches a full charge. In one embodiment, full charge may mean that a battery cell has at least a 97% SoC according to a coulomb counting method. In one embodiment, the battery cell may be charged to full capacity (i.e. a full charge) at room temperature (e.g., 20-25 degrees Celsius).

At 1010, the testing system discharges the battery cell to obtain a discharge capacity. The fully charged battery cell may be fully discharged (e.g., discharged until a certain cut-off voltage is achieved). In one embodiment, the battery cell may be discharged at room temperature.

At 1015, the testing system recharges the battery cell to a full charge and modifies the ambient temperature of the battery cell to a first temperature. In one embodiment, the battery cell may be within a testing chamber that is capable of having its temperature modified. For example, the ambient temperature with the test chamber may be set and maintained at 35 degrees Celsius, 10 degrees Celsius, 0 degrees Celsius, -10 degrees Celsius, and the like. In one embodiment, the ambient temperature may be set and maintained at any temperature such as between -50 degrees Celsius and 43 degrees Celsius.

At 1020, the testing system discharges the battery cell at a second C-rate until the discharge capacity is equal to discharge capacity x. The variable x may be modified throughout different iterations of process 1000. Variable x may be initialized to 95 and may be incrementally reduced by any value such as 5. The second C-rate may be different from the first C-rate described in relation to FIG. 9. For example, the first C-rate may be 1C and the second C-rate may be 0.5C. As a result, in a first iteration the testing system discharges the battery cell at the C-rate of 0.5C until the discharge capacity of the battery cell is 95%. The discharge capacity may be estimated based on a coulomb counting methodology.

At 1025, the testing system allows the battery cell to rest, at the first temperature, for time period y and after time period y obtains the voltage. The variable y may be modified throughout different interactions of process 1000. Variable y may be initialized to 0 seconds and may be incrementally increased by an amount of seconds (e.g. 5), minutes (e.g. 10), and/or hours (e.g. 1). For example, according to a coulomb counting method indicating a SoC is 95% (i.e. discharge capacity x) immediately after (i.e. 0 seconds after the SoC is indicated to be 95%) a voltage measurement may be taken. The testing machine may the perform a voltage-based SoC estimation treating the measured voltage as an OCV. The resulting SoC estimation may be referred to as an SoC error value because it is known that with such a short rest period that an SoC estimation based on the measured voltage is inaccurate due to the voltage volatility at the short rest period. For example, the SoC error value may indicate the estimated SoC at 0 seconds is 79.96%, which is in stark contrast to the SoC of 95% that was determined by a coulomb counting method at 1020. The testing system may associate, within a data store, the voltage reading, the time period y, the SoC error value, and the SoC determined at 1020. The information within the data store may be utilized to determine an SoC delta that may be used to improve SoC estimations.

At 1030, the testing system determines if there are additional time periods to obtain the voltage for. If there are additional time periods then variable y is incremented and process 1000 returns to 1025. Thus, allowing the testing system to obtain a variety of data points (e.g., SoC error values, voltage measurements, and the like) for various rest times after a discharge. In one embodiment, variable y may be incremented by 5 seconds. However, if there are not additional time periods then process 1000 moves to 1040.

At 1040, the testing system determines if the battery cell is fully discharged. If the battery cell is not fully discharged then process 1000 moves to 1045 and variable x is modified and process 1000 returns to 1020. In one embodiment, variable x may be decreased by 5. Thus allowing data points to be determined for multiple SoCs. However, if the battery cell is fully discharged then process 1000 moves to 1050 and the data points are recorded within a data store. In one embodiment, processes 1015-1050 may be repeated for a different temperature. In such an embodiment, the first temperature may be incremented to a second temperature which may be above or below the first temperature. By modifying the temperature, SoC error values may be determined for different temperatures.

Once the SoC error values have been determined by one or more processes associated with FIG. 10 and the coulomb counted SoC values and corresponding true OCV values are determined by one or more processes associated with FIG. 9, then the testing system may determine one or more temperature-based SoC deltas. A process similar to that described in FIG. 4 may be followed to determine one or more temperature-based SoC delta. The process may differ with an inclusion of determining an a first temperature in addition to determining a first SoC (e.g., at 405 in FIG. 4). Thus, a temperature value may be considered when determining SoC deltas such that a SoC delta value may be for a certain SoC at a certain temperature.

Similarly, an SoC reading obtained by a BMS may be modified by a process similar to that as shown in FIG. 5. The process may differ with an inclusion of receiving a first temperature of a battery associated with the BMS (e.g., at 505 in FIG. 5). Thus, a temperature value may be considered when retrieving a SoC delta value that may be used to modify an SoC reading such that the SoC delta value retrieval may be based on a certain battery temperature detected by the BMS.

Embodiments disclosed herein allow for voltage-based SoC measurements to be corrected (i.e. modified) based on previously generated data from Coulomb counting methods. The voltage-based SoC measurements may be corrected by based on previously generated data points. For example, an SoC value may be retrieved from a data store based at least on, a current temperature, a rest period, a measured voltage at a first time, a measured voltage at a second time, a voltage delta (the change in the measured voltage over a time period), a discharge C-rate, and the like. These various data points may be utilized to query a data store that indicates characteristics of a battery cell at different instances. For example, an SoC value may be retrieved by querying a data store with a C-rate and a voltage delta to determine an SoC value that has a similar voltage delta at the same C-rate. Thus, a BMS system may rely less on the actual measured SoC value, but instead may rely on other data points to query a database to determine a more accurate SoC value based on prior measures battery cell characteristics at different SoCs.

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter.

While the present subject matter has been described in detail with respect to specific embodiments thereof, it will be appreciated that those skilled in the art, upon attaining an understanding of the foregoing may readily produce alterations to, variations of, and equivalents to such embodiments. Accordingly, it should be understood that the present disclosure has been presented for purposes of example rather than limitation, and does not preclude inclusion of such modifications, variations, and/or additions to the present subject matter as would be readily apparent to one of ordinary skill in the art. Indeed, the methods and systems described herein may be embodied in a variety of other forms; furthermore, various omissions, substitutions and changes in the form of the methods and systems described herein may be made without departing from the spirit of the present disclosure. The accompanying claims and their equivalents are intended to cover such forms or modifications as would fall within the scope and spirit of the present disclosure.

Conditional language used herein, such as, among others, "can," "could," "might," "may," "e.g.," and the like, unless specifically stated otherwise, or otherwise understood within the context as used, is generally intended to convey that certain examples include, while other examples do not include, certain features, elements, and/or steps. Thus, such conditional language is not generally intended to imply that features, elements and/or steps are in any way required for one or more examples or that one or more examples necessarily include logic for deciding, with or without author input or prompting, whether these features, elements and/or steps are included or are to be performed in any particular example.

The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Similarly, the use of "based at least in part on" is meant to be open and inclusive, in that a process, step, calculation, or other action "based at least in part on" one or more recited conditions or values may, in practice, be based on additional conditions or values beyond those recited. Headings, lists, and numbering included herein are for ease of explanation only and are not meant to be limiting.

The various features and processes described above may be used independently of one another, or may be combined in various ways. All possible combinations and sub-combinations are intended to fall within the scope of the present disclosure. In addition, certain method or process blocks may be omitted in some embodiments. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel, or in some other manner. Blocks or states may be added to or removed from the disclosed examples. Similarly, the example systems and components described herein may be configured differently than described. For example, elements may be added to, removed from, or rearranged compared to the disclosed examples.

What is claimed is:

1. A computer-implemented method for generating and displaying a modified state of charge (SoC) estimation, comprising:
   receiving a first SoC of a test battery cell associated with a first methodology for determining a SoC of the test battery cell;
   receiving a second SoC of the test battery cell associated with a second methodology for determining the SoC of the test battery cell after a first rest period initiated by the step of receiving the first SoC;
   comparing the first SoC and the second SoC to determine a SoC delta value associated with the first rest period;
   modifying a current SoC reading associated with a battery cell within an electronic vehicle (EV) by the SoC delta value to generate a modified SoC reading; and
   displaying, to an interface within the EV, the modified SoC reading,
   wherein the SoC delta value is determined by:
      receiving a past SoC reading associated with a period of time prior to the EV being turned off;
      receiving a second rest period associated with a period of time between the EV being turned off and the EV being turned back on; and
      querying a data store based at least in part on the past SoC reading and the second rest period.

2. The computer-implemented method of claim 1, wherein the first methodology is based at least in part on a coulomb counting method and the second methodology is based at least in part on a voltage reading method.

3. The computer-implemented method of claim 1, wherein the first SoC is determined based at least in part on a first discharge C-rate and the second SoC is determined based at least in part on a second discharge C-rate and the first discharge C-rate is distinct from the second discharge C-rate.

4. The computer-implemented method of claim 1, wherein the test battery cell and the battery cell within the EV are of a same battery type.

5. The computer-implemented method of claim 4, wherein the same battery type is a lithium ion battery.

6. The computer-implemented method of claim 1, wherein the first SoC of the test battery cell and the second SoC of the test battery cell are associated with the same discharge capacity state of the test battery cell.

7. A non-transitory computer-readable storage medium having stored thereon instructions for causing at least one computer system to generate and display a modified state of charge (SoC) estimation, the instructions comprising:
receiving a first SoC of a test battery cell associated with a first methodology for determining a SoC of the test battery cell;
receiving a second SoC of the test battery cell associated with a second methodology for determining the SoC of the test battery cell after a first rest period initiated by the step of receiving the first SoC;
comparing the first SoC and the second SoC to determine a SoC delta value associated with the first rest period;
modifying a current SoC reading associated with a battery cell within an electronic vehicle (EV) by the SoC delta value to generate a modified SoC reading; and
displaying, to an interface within the EV, the modified SoC reading,
wherein the instructions further comprise:
receiving a past SoC reading associated with a period of time prior to the EV being turned off;
receiving a second rest period associated with a period of time between the EV being turned off and the EV being turned back on; and
querying a data store based at least in part on the past SoC reading and the second rest period to determine the SoC delta value.

8. The non-transitory computer-readable storage medium of claim 7, wherein the first methodology is based at least in part on a coulomb counting method and the second methodology is based at least in part on a voltage reading method.

9. The non-transitory computer-readable storage medium of claim 7, wherein the first SoC is determined based at least in part on a first discharge C-rate and the second SoC is determined based at least in part on a second discharge C-rate and the first discharge C-rate is distinct from the second discharge C-rate.

10. The non-transitory computer-readable storage medium of claim 7, wherein the test battery cell and the battery cell within the EV are of a same battery type.

11. The non-transitory computer-readable storage medium of claim 10, wherein the same battery type is a lithium ion battery.

12. The non-transitory computer-readable storage medium of claim 7, wherein the first SoC of the test battery cell and the second SoC of the test battery cell are associated with the same discharge capacity state of the test battery cell.

13. A system for generating and displaying a modified state of charge (SoC) estimation, comprising:
one or more processors; and
a memory coupled with the one or more processors, the memory configured to store instructions that when executed by the one or more processors cause the one or more processors to:
receive a first SoC of a test battery cell associated with a first methodology for determining a SoC of the test battery cell;
receive a second SoC of the test battery cell associated with a second methodology for determining the SoC of the test battery cell after a first rest period initiated by the step of receiving the first SoC;
compare the first SoC and the second SoC to determine a SoC delta value associated with the first rest period;
modify a current SoC reading associated with a battery cell within an electronic vehicle (EV) by the SoC delta value to generate a modified SoC reading; and
display, to an interface within the EV, the modified SoC reading,
wherein the instructions that when executed by the one or more processors further cause the one or more processors to:
receive a past SoC reading associated with a period of time prior to the EV being turned off;
receive a second rest period associated with a period of time between the EV being turned off and the EV being turned back on; and
query a data store based at least in part on the past SoC reading and the second rest period to determine the SoC delta value.

14. The system of claim 13, wherein the first methodology is based at least in part on a coulomb counting method and the second methodology is based at least in part on a voltage reading method.

15. The system of claim 13, wherein the first SoC is determined based at least in part on a first discharge C-rate and the second SoC is determined based at least in part on a second discharge C-rate and the first discharge C-rate is distinct from the second discharge C-rate.

16. The system of claim 13, wherein the test battery cell and the battery cell within the EV are of a same battery type.

17. The system of claim 16, wherein the same battery type is a lithium ion battery.

* * * * *